United States Patent
Buzcek et al.

[11] Patent Number: 6,159,905
[45] Date of Patent: Dec. 12, 2000

[54] METHODS FOR JOINING HIGH TEMPERATURE SUPERCONDUCTING COMPONENTS WITH NEGLIGIBLE CRITICAL CURRENT DEGRADATION AND ARTICLES OF MANUFACTURE IN ACCORDANCE THEREWITH

[76] Inventors: David M. Buzcek, 81 Tisdale Rd., Dover, Mass. 02030; John D. Scudiere, 200 Annie Moore Rd., Bolton, Mass. 01740; Richard E. Harnois, 1800 West St., Wrentham, Mass. 02093; Sergio Spreafico, Via Carpani 17, 22031 Albavilla (Como); Laura Gherardi, Via Canesi 8, 20052 Monza (Milan), both of Italy

[21] Appl. No.: 09/324,229

[22] Filed: Jun. 2, 1999

[51] Int. Cl.[7] .............................. B32B 7/04; H01B 12/00; H01L 39/24
[52] U.S. Cl. ........................ 505/234; 505/220; 505/236; 505/470; 505/927; 428/930; 174/125.1
[58] Field of Search ..................................... 505/220, 231, 505/234, 236, 434, 470, 739; 174/125.1; 428/114, 195, 198, 930

[56] References Cited

U.S. PATENT DOCUMENTS

| | | | |
|---|---|---|---|
| 5,082,164 | 1/1992 | Rumaner et al. | 228/176 |
| 5,116,810 | 5/1992 | Joshi et al. | 505/1 |
| 5,149,686 | 9/1992 | Ekin et al. | 505/1 |
| 5,244,876 | 9/1993 | Preisler et al. | 505/1 |
| 5,253,413 | 10/1993 | Dorri et al. | 29/599 |
| 5,321,003 | 6/1994 | Joshi et al. | 505/220 |
| 5,332,988 | 7/1994 | Zhukovsky et al. | 335/216 |
| 5,358,929 | 10/1994 | Fujikami et al. | 505/100 |
| 5,439,879 | 8/1995 | Salama et al. | 505/500 |
| 5,786,304 | 7/1998 | Kimura et al. | 505/234 |
| 5,801,124 | 9/1998 | Gamble et al. | 505/230 |

FOREIGN PATENT DOCUMENTS

| | | |
|---|---|---|
| 0 077 539 | 4/1983 | European Pat. Off. . |
| 0 545 608 | 11/1992 | European Pat. Off. . |
| 0 786 783 | 7/1997 | European Pat. Off. . |
| 4-202061 | 7/1992 | Japan . |
| 93/20025 | 10/1993 | WIPO . |

OTHER PUBLICATIONS

2 Search reports prepared on May 14, 1997, by NERAC.

*Primary Examiner*—Mark Kopec

[57] ABSTRACT

A method for joining high temperature superconducting components while minimizing critical current degradation is provided. The articles formed have critical currents that are at least 80 % of the critical current of the high temperature superconducting components. The invention further provides splicing geometries that facilitate wrapping joined components around a mandrel, tube or the like with minimal critical current degradation and without kinking or flexion of the joined components.

32 Claims, 5 Drawing Sheets

METHODS FOR JOINING HIGH TEMPERATURE SUPERCONDUCTING COMPONENTS WITH NEGLIGIBLE CRITICAL CURRENT DEGRADATION AND ARTICLES OF MANUFACTURE IN ACCORDANCE THEREWITH

TECHNICAL FIELD

The present invention generally relates to methods for joining high temperature superconducting components. The invention more particularly relates to joining high temperature superconducting components having predetermined splice geometries such that critical current degradation is negligible or minimized.

BACKGROUND OF THE INVENTION

Superconductors are materials which lack measurable electrical resistivity below a transition temperature (i.e., critical temperature, $T_c$). Materials having a $T_c$ of 20 K and above are generally referred to as high-temperature superconductors (HTS). Superconducting materials also exhibit a critical current, $I_c$, which is the current at a specified temperature (and in the absence of external magnetic fields) above which the material is normal and below which the material is superconducting.

In order to obtain better mechanical properties, it is common to use composites of HTS materials and metals rather than using superconducting materials alone. These composites may be prepared in elongated forms such as wires and tapes by a well-known process which includes the three stages of: (i) forming a powder of superconductor precursor material (precursor powder formation stage); (ii) filling a metal container, such as a tube, billet or grooved sheet, with the precursor powder, and deformation processing one or more filled containers to provide a composite of reduced cross-section including one or more cores of superconductor precursor material in a surrounding noble metal matrix (composite precursor fabrication stage); and (iii) subjecting the composite to successive physical deformation and annealing cycles and further thermally processing the composite to form and sinter a core material having the desired superconducting properties (thermomechanical processing). The alignment of precursor grains in the core ("textured" grains) caused by the deformation process facilitates the growth of well-aligned and sintered grains of the desired superconducting material during later thermal processing stages.

The general process, commonly known as "powder-in-tube" or "PIT," is practiced in several variants depending on the starting powders, which may be, for example, metal alloys having the same metal content as the desired superconducting core material in the "metallic precursor" or "MPIT" process, or mixtures of powders of the oxide components of the desired superconducting oxide core material or of a powder having the nominal composition of the desired superconducting oxide core material in the "oxide powder" or "OPIT" process. General information about the PIT method described above and processing of the oxide superconductors is provided by Sandhage et al., in JOM, Vol. 43, No. 3 (1991) pages 21–25, and the references cited therein. Sandhage et al., in JOM, Vol. 43, No. 3 (1991) pages 21–25 is incorporated herein by reference.

As an example of the PIT method, a (Bi,Pb)SCCO precursor powder may be packed into a silver sheath to form a billet. The billet is extruded to a diameter of about ⅓ of the original diameter and then narrowed with multiple die passes. A mono-filamentary tape is fabricated by further extrusion and/or drawing of the billet to a wire, and then rolling the wire, for example, to a 0.006"×0.100" tape. Alternatively, a multi-filamentary tape may be fabricated by multiple die passes through hexagonally shaped dies of varying sizes to form a silver sheathed (Bi,Pb)SCCO hexagonal wire. Several of the hexagonal wires may bundled together and drawn through a round die to form a multi-filamentary round wire. The round wire may then be rolled, for example, to form a multi-filamentary silver and (Bi,Pb)SCCO composite precursor tape of a width of about 0.080" to 0.200" and a thickness of about 0.004" to 0.010". The composite may be textured using by one or more texturing deformation steps.

It is often desirable to have long lengths (e.g., 1000 m) of such composites in the form of a wire or the like. For example, in the context of power transmission lines, it is desirable to wrap long lengths of HTS wire. Consequently, it is frequently necessary to splice composite wires together in order to form a joined wire of sufficient length.

U.S. Pat. Nos. 5,116,810 and 5,321,003, both to Joshi et al., are directed to processes and products for making electrical connections between superconducting elements, by joining metallic precursor elements prior to conversion to the oxide superconductor. Since the joints are formed prior to the oxidation process, joints formed in accordance with these patents are substantially non-resistive in nature. However, it is frequently inconvenient to perform such joining operations on HTS precursors, rather than on components in the superconducting state.

The inventors faced the problem of avoiding the disadvantages rising from joining superconducting components, including local strain concentration of the wire as a result of the thickness gradient of the joint and of the winding process. Prior art techniques have been deficient in that the joined wires used often suffer from significant critical current degradation. Wires formed by these techniques also experience further critical current degradation as a result of local strain concentrations during the winding process.

It would therefore be desirable to provide methods for joining HTS components such that critical current degradation is negligible or minimized, thereby overcoming the shortcomings associated with the prior art.

SUMMARY OF THE INVENTION

The present invention provides methods for joining high temperature superconducting components, which minimize critical current degradation. This is accomplished by splicing or joining at least two high temperature superconducting components in a manner that results in articles having critical currents that are close to the critical currents of each of the high temperature superconducting components. The high temperature superconducting components may comprise (Bi,Pb)SSCO, YBCO, or other high temperature superconducting compositions.

In one aspect, the invention comprises a high temperature superconducting article, which comprises two high temperature superconducting components. The high temperature superconducting components are connected by means of a solder layer, and a further protective layer is attached to the components. The connected portions of the components form an overlap segment; when the critical current is measured over an article length at least 100 times the length of the overlap segment, the critical current is at least 80% of the lesser of the critical currents of the individual components. Preferably, the critical current may be at least 85%, at least 90%, at least 95%, or at least 99% of the lesser of the critical currents of the individual components. Critical current is determined using a 1 $\mu$V/cm criterion. The superconducting components may be formed of the same material, and may comprise a (Bi,Pb)SSCO or YBCO superconductor. The protective layer may comprise a material selected from the group consisting of stainless steel, copper, copper—beryllium alloys, nickel-base superalloys, and nickel—iron-base superalloys, and may be attached to the components by means of a second solder material. This second solder material may have a lower melting temperature than the first material. The ends of the superconducting components may be triangular, diagonal, or inverted triangular.

In another aspect, the invention comprises a method of joining high temperature superconducting components. Two high temperature superconducting components are joined by means of solder, and a protective layer is applied to the components. The connected portions of the components form an overlap segment; when the critical current is measured over an article length at least 100 times the length of the overlap segment, the critical current is at least 80% of the lesser of the critical currents of the individual components. Preferably, the critical current may be at least 85%, at least 90%, at least 95%, or at least 99% of the lesser of the critical currents of the individual components. Critical current is determined using a 1 $\mu$V/cm criterion.

The foregoing has outlined some of the more pertinent objects of the present invention. These objects should be construed to be merely illustrative of some of the more prominent features and applications of the invention. Many other beneficial results can be attained by applying the disclosed invention in a different manner or modifying the invention as will be described. Accordingly, other objects and a fuller understanding of the invention may be had by referring to the following Detailed Description of the Preferred Embodiments.

BRIEF DESCRIPTION OF THE DRAWINGS

For a fuller understanding of the present invention, reference is had to the following description taken in conjunction with the accompanying drawings, in which:

FIGS. 3A–3C respectively show the splice geometries of FIGS. 2B, 2C and 2E in conjunction with a mandrel.

Similar reference characters refer to similar parts throughout the several views of the drawings.

DETAILED DESCRIPTION OF THE PREFERRED EMBODIMENTS

High temperature superconductor wires or tapes formed in accordance with the present invention are suitable for use in a variety of applications. Because of the splicing techniques employed, these wires or tapes are particularly useful in situations where long lengths (e.g., 1000 m) of wire are desirable or required. As discussed herein, for example, joined wires formed in accordance with the present invention can be wound around mandrels, tubes and the like for use as power transmission lines. The alternative splicing geometries provided by the present invention, in conjunction with an applied protective layer, facilitate wrapping the wires or tapes around the mandrel and minimize critical current degradation. The components are suitable for use as power transmission lines, DC cables and current leads where the winding format occurs with a pitch.

As used herein, critical currents may be measured by any of the methods described in Elkin, *Appl. Phys. Lett.* 56(9):905–907; Goodrich, et al., *Cryogenics* 30:667–677; or Schwenterly, et al., *IEEE Trans. on Applied Supercond.* 3(1):949–952, all of which are incorporated herein by reference. The methods of Elkin were used to determine the critical currents reported herein, using a 1 $\mu$V/cm criterion.

Figure 1:
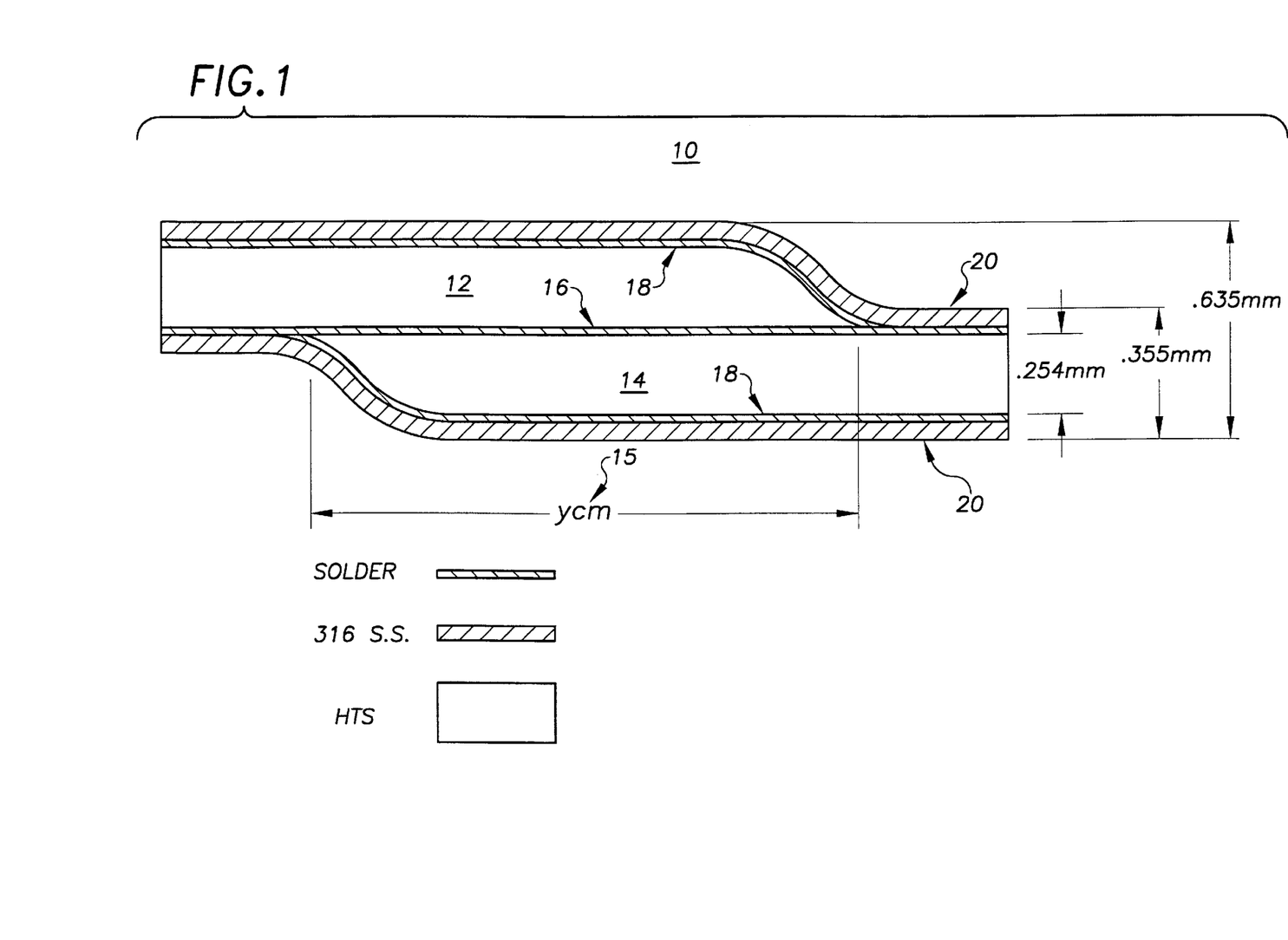
FIG. 1 illustrates a high temperature superconductor laminate joint in accordance with one embodiment of the present invention.

Referring now to FIG. 1, laminate joint 10 includes high temperature superconducting (HTS) components 12 and 14. HTS components 12 and 14 each include at least one oxide superconducting filament (i.e. HTS filament) embedded in a noble metal matrix, where a metal is considered to be "noble" if its reaction products are thermodynamically unstable under the reaction conditions employed relative to the desired superconducting ceramic, or if it does not react with the superconducting ceramic or its precursors under the conditions of manufacture of the composite. Such HTS components can be made, for example, by powder-in-tube methods. Suitable noble metals include, for example, silver (Ag), gold (Au), platinum (Pt), palladium (Pd) and alloys thereof. The HTS filament can be a mono-filament or multi-filament. For example and while not to be construed as limiting, suitable HTS filament counts may range from 19 to 121. In a preferred embodiment, HTS components 12 and 14 are formed of the same material, for example of 85 (Bi,Pb) SSCO filaments embedded in a silver metal matrix. HTS components 12 and 14 are in their superconducting state (i.e., not precursors) at the time that the joint is formed. This facilitates processing in the field, since joined components need not be heat treated or otherwise processed to form superconducting oxides.

Components 12 and 14 are joined together by solder material 16. While a variety of materials can be used to solder components 12 and 14, it is important that the material of solder 16 be such that critical current degradation across the area of overlap (shown in FIGS. 1 and 2 as y) is negligible or minimized. Exemplary solder materials 16 include standard silver—lead—tin and lead—tin solders. In one embodiment, the melting point of solder material 16 is about 285° C. and the melting point of solder 18 is about 185° C. As discussed herein, the melting point of solder 16 preferably is greater than the melting point of solder 18 such that the solder material 16 does not begin to reflow when the protective material is applied.

Once the HTS wire is joined (i.e. by soldering HTS components 12 and 14 together), the joined wire may be subjected to lamination by a protective material 20. In a preferred embodiment, protective material 20 is stainless steel (e.g. 316 stainless steel), but other protective materials, such as copper and beryllium—copper alloys, also fall within the scope of the invention. Protective material 20 may also be used to protect the noble metal matrix. When silver is used as the wire material, for example, the protective material 20 protects the silver and makes the laminate more robust.

Protective material 20 is joined to the joined wire using solder 18. Exemplary solder materials 18 include 3% Ag/97% Pb, 10% Sn/88% Pb/2% Ag, 5% Sn/95% Pb, 5% Sn/94% Pb/2% Ag, 3% Sn/97% Pb, 63% Sn/37% Pb, 62%

Sn/36% Pb/2% Ag and 60% Sn/40% Pb (all percentages are weight percent). The first five of these exemplary solder compositions are relatively high melting point solders, and are preferred for material 16, while the last three are near-eutectic, low melting point solders, and are preferred for material 18. The melting point of solder 16 preferably is greater than the melting point of solder 18 such that the solder joint does not begin to reflow when the solder 18 is applied. If desired, lamination of protective material 20 to the joined wire may be accomplished using two rolls of protective material, one roll above a roll of joined HTS wire and one roll below the roll of joined wire. The three rolls are then passed through a solder bath to form the laminated wire. Methods of laminating superconducting wires are disclosed in U.S. Pat. No. 5,801,124, issued Sep. 1, 1998, and in copending and commonly assigned U.S. application Ser. Nos. 08/701,375 and 08/705,811, both filed Aug. 30, 1996, all of which are incorporated herein by reference.

A protective material may not always be required (for example, in coil applications). The use of a protective material, however, can be used to reduce problems associated with poor mechanical performance with regard to winding.

The resulting laminates 10 formed in accordance with the present invention are advantageous in that critical current degradation is minimized across the joined overlap length (shown in FIG. 1 as y). The joints so formed exhibit superior strength, minimizing local strain concentrations (e.g., due to kinking, flexion, and torsion) at the joint, and low resistivity, minimizing the degradation of the critical current of the jointed wire.

In addition, the laminates can be formed in a manner that minimizes critical current degradation even though the laminates are subjected to bending, winding or the like. For example, laminate joint 10 may be wound around mandrels, tubes and the like for use as power transmission lines. Various splicing geometries or configurations for forming laminate joints are shown in FIGS. 2A–2E. These splicing configurations can be used to join HTS components such that the laminates can be wound around mandrels with minimal critical current degradation. This is a significant improvement over prior art techniques of joining HTS components because the present invention provides laminate joints that account for the bending and/or winding process.

For instance, a longer overlap in the joined wire (shown in FIGS. 1 and 2 as y) is typically desirable for minimizing resistance because of increased surface area of the joint materials. In situations where the laminate is to be wound around a mandrel, however, a shorter overlap is typically desirable. Laminate joints formed in accordance with the present invention are designed to account for such variables and minimize critical current degradation. In some embodiments, overlaps in accordance with the present invention are about 5–15 cm in length. It will be appreciated by those skilled in the art, however, that such overlap lengths are not so limited and will vary depending on the application.

Referring now to FIGS. 2A–2E, plan views of several alternative splice geometries for high temperature superconductor joints in accordance with the present invention are shown. The embodiments illustrated in FIGS. 2A–2E are shown without the protective material 20. It will be appreciated that the embodiments shown in FIGS. 2A–2E can be laminated as discussed hereinabove.

Figure 2A:
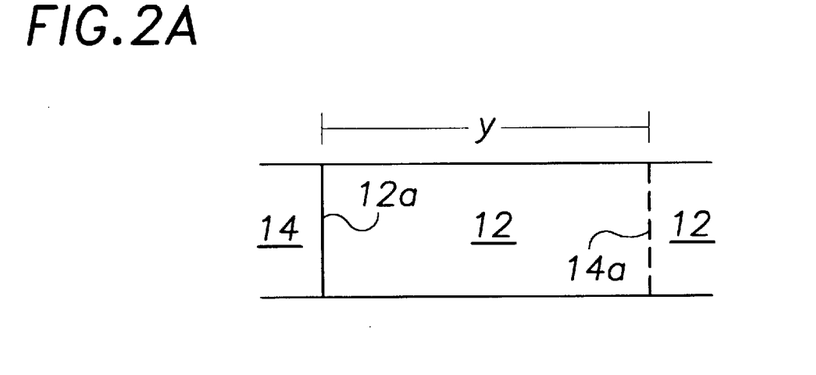
FIGS. 2A–2E illustrate plan views of alternative splice geometries for high temperature superconductor joints in accordance with the present invention.

The embodiment illustrated in FIG. 2A has a perpendicular geometry or configuration (i.e. the respective ends 12a and 14a of HTS components 12 and 14 are perpendicular or substantially perpendicular to the overlap y). Components 12 and 14 are joined together using solder 16 as discussed hereinabove. The embodiment shown in FIG. 2A may be desirable for coil geometries, whose applications include electric motors, generators, and transformers.

In some embodiments, it may be desirable to utilize HTS components having non-perpendicular ends. In particular, the HTS components in such embodiments each have an end with a splice geometry or configuration having predetermined angles other than 90°. When winding a joined wire around a mandrel or the like, for example, it may be desirable to configure the ends of the joined components with angles and configurations to facilitate such wrapping. Embodiments illustrating such configurations are shown in FIGS. 2B–2E.

Figure 2B:
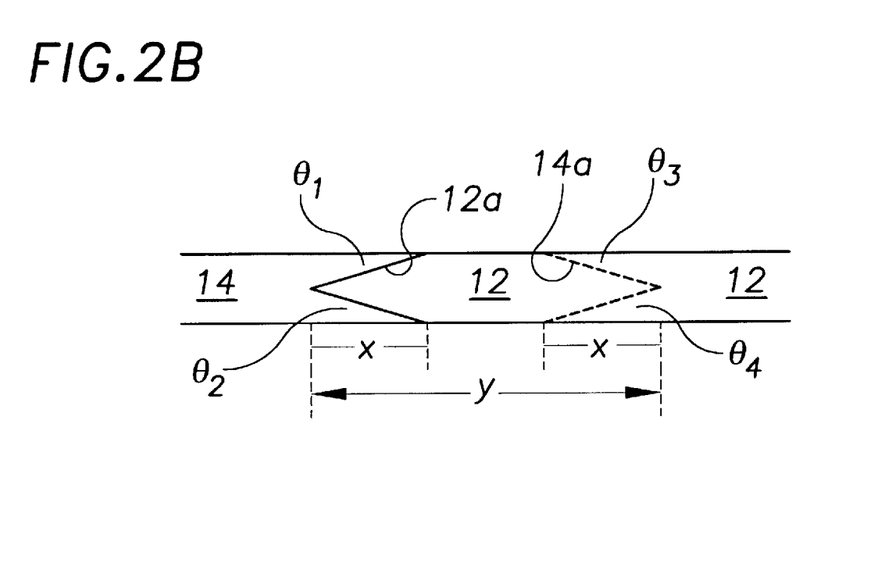

As shown in FIG. 2B, end 12a of HTS component 12 is configured in the form a substantially triangular end. $\theta_1$ and $\theta_2$ preferably are between about 4–60°. While it is not necessary that $\theta_1$ and $\theta_2$ are equal, it is preferred that the angles of $\theta_1$ and $\theta_2$ be equal. As also shown in FIG. 2B, end 14a of HTS component 14 is similarly configured in the form a substantially triangular end. $\theta_3$ and $\theta_4$ preferably are between about 4–60°. While it is not necessary that $\theta_3$ and $\theta_4$ are equal, it preferred that the angles of $\theta_3$ and $\theta_4$ be equal.

As discussed herein, the distance x can be varied depending on the application being utilized. In some situations, it may be desirable to have x relatively long (relative to the overlap distance y) to prevent flexing when the joined material is wound around a relatively small diameter tube or mandrel. In such situations, angles $\theta_1$, $\theta_2$, $\theta_3$ and $\theta_4$ are varied accordingly. In other circumstances, it maybe desirable to have x relatively short (relative to the overlap distance y) to prevent flexing when the joined material is wound around a relatively large diameter tube or mandrel. In this manner, the geometry of the joined wire can be altered for use in conjunction with a mandrel without significant critical current degradation.

Figure 2C:
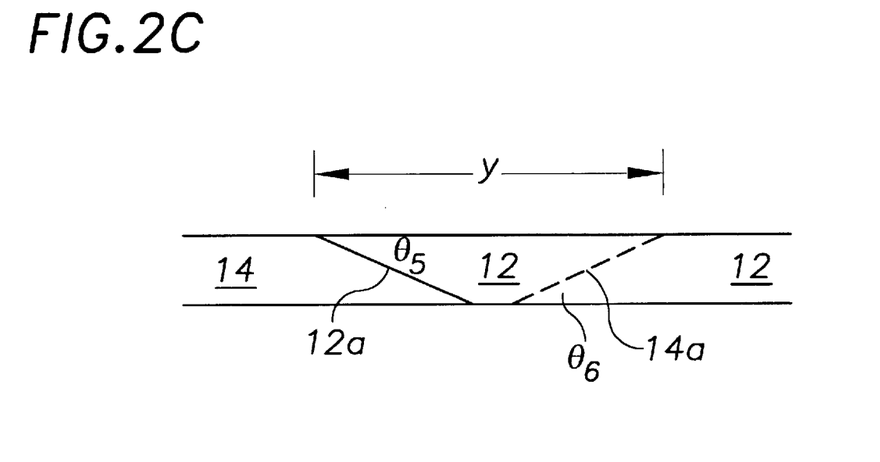
Figure 2D:
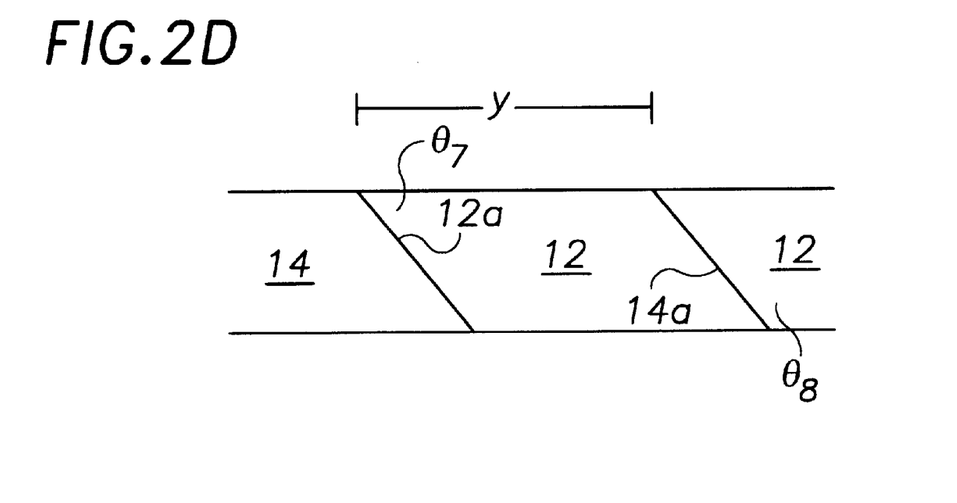

Another alternative embodiment for splicing geometry is shown in FIG. 2C. As shown in FIG. 2C, end 12a of HTS component 12 has a diagonal end (i.e. the end has a slanted or oblique direction). $\theta_5$ preferably is between about 4–60°. Similarly, end 14a of HTS component 14 has a diagonal end. $\theta_6$ preferably is between about 4–60°. The embodiment shown in FIG. 2D is similar to that shown in FIG. 2C in that ends 12a and 14a each have diagonal ends (i.e. the ends have a slanted or oblique direction). In the embodiment shown in FIG. 2D, $\theta_8$ is greater than 90° while $\theta_6$ in FIG. 2C is less than 90°. $\theta_7$ preferably is between about 4–60°.

Figure 2E:
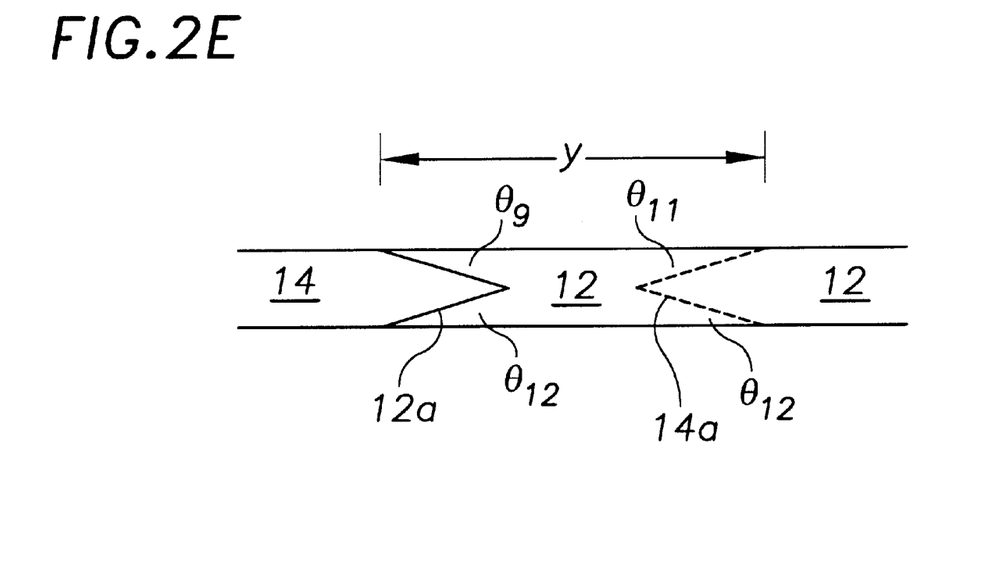

FIG. 2E illustrates yet another alternative embodiment in accordance with the present invention. In this embodiment, end 12a of HTS component 12 is configured in the form of a substantially inverted triangular end. $\theta_9$ and $\theta_{10}$ also each form a triangular configuration. Likewise, end 14a of HTS component 14 is configured in the form of a substantially inverted triangular end. $\theta_{11}$, and $\theta_{12}$ also each form a triangular configuration.

The embodiments shown above, and in particular the embodiments shown in FIGS. 2A–2E, allow the laminated joined wire to be wound around a mandrel or the like without or substantially without critical current degradation.

Figure 3A:
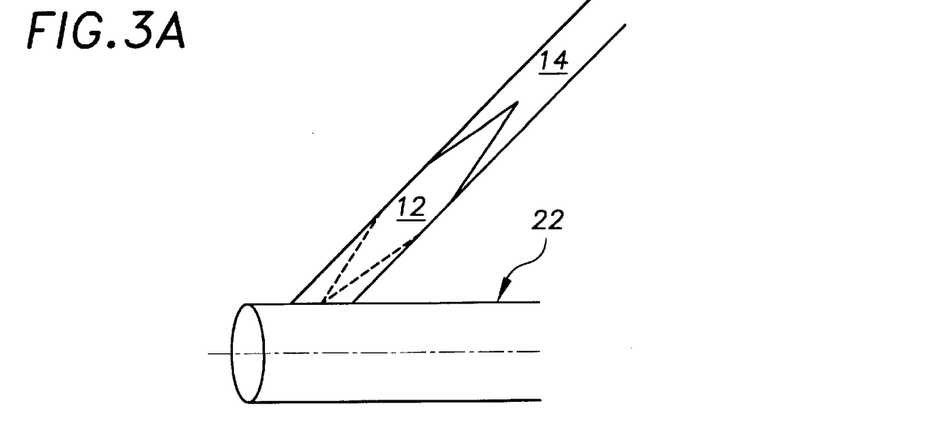
Figure 3B:
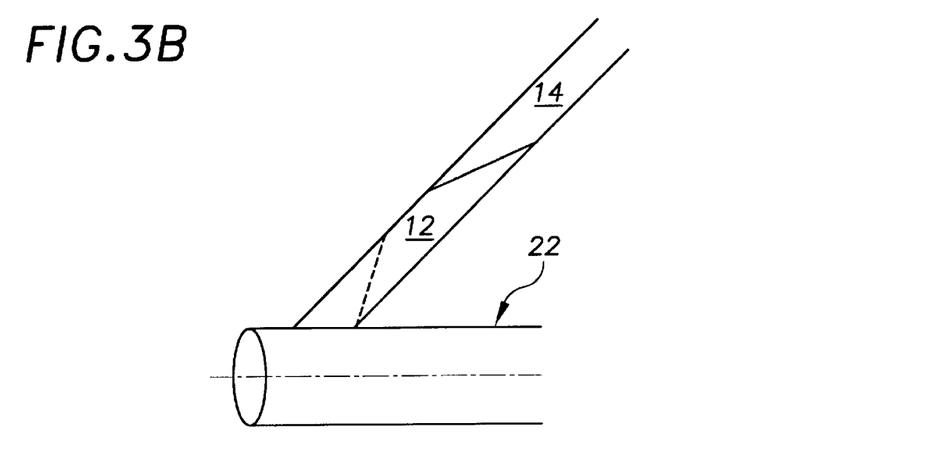

The embodiments shown in FIGS. 2B–2E are the most preferred of the illustrated embodiments. Such configurations also facilitate bending or winding of the laminate without kinking. FIGS. 3A–3C respectively show the splice geometries of FIGS. 2B, 2C and 2E in conjunction with a mandrel. The material of construction for mandrel 22 can be varied depending on the desired application. For power transmission lines, it may be desirable to have the mandrel 22 formed of stainless steel, copper, or aluminum.

The present invention thus provides a method for improving mechanical performance of spliced HTS wire during mechanical twisting and the like. More specifically, the present method provides joined HTS components with minimal critical current degradation and minimal local strain concentrations.

The invention can be modified to adjust for various processing criteria. For example, the splice geometry can be altered to avoid or minimize formation of gaps between the mandrel and the wound tape along the splice. The length of the overlap in the joint can be lengthened or shortened to account for parameters such as resistance, pitch, diameter of the mandrel, tube or the like. When a non-perpendicular geometry is used, the splice configuration allows for a longer cut, thereby providing a more gradual thickness variation. This may be advantageous, for example, when winding around a mandrel. As discussed above, one of the advantages of the splice geometries provided by the present invention is the ability to minimize resistance. When two or more HTS tapes are joined in accordance with the present invention, the resistance of the joint is minimized by the splice geometry and resulting current distribution.

These joining techniques may be applied to the application of forming superconducting cables which comprise multiple superconducting filaments wound around a core. Some techniques and cable configurations suitable for use with the invention are given, for example, in European Patent 0 786 783, incorporated herein by reference.

The following examples are intended to be illustrative and should not be construed as limiting the invention.

EXAMPLE 1

A silver wire laminated with stainless steel and having the splice geometry shown in FIG. 2A was tested for critical current degradation after splicing. In this example, the wire laminate was not bent; the critical current was measured before and after splicing without bending the wire laminate.

In particular, the silver wire laminated with stainless steel in this example had a width of about 0.162 inches and a thickness of 0.0125 inches. The critical currents at various sections in the laminate before cutting the laminate for lap-joint are shown in Table 1.

TABLE 1

Before cutting for lap joint.

| Sample ID. | Length (cm.) | Critical current (A) (using a 1 $\mu$V/cm criterion for zero resistivity) |
|---|---|---|
| Wire Length | 18620 | 28.1 |
| 1st Section | 1960 | 27.7 |
| 2nd Section | 1960 | 30.5 |
| 3rd Section | 1960 | 29.5 |
| 4th Section | 1960 | 29.3 |
| 5th Section | 1960 | 28.5 |
| 6th Section | 1960 | 27.7 |

TABLE 1-continued

Before cutting for lap joint.

| Sample ID. | Length (cm.) | Critical current (A) (using a 1 $\mu$V/cm criterion for zero resistivity) |
|---|---|---|
| 7th Section | 1960 | 27.1 |
| 8th Section | 1960 | 27.3 |
| 9th Section | 1960 | 29.1 |
| 10th Section | 980 | 28.1 |

The critical currents at various sections in the laminate after cutting the laminate for a 5½ inch lap joint in section 5, arranged as shown in FIG. 2A, are shown in Table 2.

TABLE 2

After cut for 5½ inch lap joint in section 5.

| Sample ID. | Length (cm.) | Critical current (A) (using a 1 $\mu$V/cm criterion for zero resistivity) |
|---|---|---|
| Wire Length | 18606 | 27.9 |
| 1st Section | 1960 | 27.3 |
| 2nd Section | 1960 | 30.1 |
| 3rd Section | 1960 | 29.1 |
| 4th Section | 1960 | 28.9 |
| 5th Section | 1946 | 28.1 |
| 6th Section | 1960 | 27.3 |
| 7th Section | 1960 | 26.9 |
| 8th Section | 1960 | 26.7 |
| 9th Section | 1960 | 28.7 |
| 10th Section | 980 | 27.7 |

As can be seen, the critical current in section 5, which includes the lap joint, was not degraded more by the splicing process than the other sections.

EXAMPLE 2

In this Example, silver BSCCO (bismuth, strontium, calcium, copper and oxygen) multi-filament wire samples laminated with 304 stainless steel as described above were tested for critical current degradation. Some of the wires were tested without any splicing in the sample while other samples contained splices. All wires had a length of 50 cm. The samples containing splices had a splice geometry shown in FIG. 2B. The value of x was 1 cm and the value of y was 5 cm. The critical current of the samples was measured before and after twist testing, described below. The results are shown below in Table 3.

TABLE 3

Critical Currents Before and After Twisting

| | Before Twisting | After 16° Twisting | |
|---|---|---|---|
| Splice Length | $I_c$ (A) (using a 1 $\mu$V/cm criterion for zero resistivity) | $I_c$ (A) (using a 1 $\mu$V/cm criterion for zero resistivity) | % Retention |
| None | 60.38 | 54.7 | 91 |
| None | 60.998 | 57.2 | 94 |
| None | 66.98 | 58.4 | 96 |
| None | 58.77 | 56.6 | 96 |
| 5 cm. | 58.7 | 53.7 | 91 |

TABLE 3-continued

Critical Currents Before and After Twisting

| Splice Length | Before Twisting $I_c$ (A) (using a 1 $\mu$V/cm criterion for zero resistivity) | After 16° Twisting $I_c$ (A) (using a 1 $\mu$V/cm criterion for zero resistivity) | % Retention |
| --- | --- | --- | --- |
| 5 cm. | 60.58 | 57.8 | 95 |
| 5 cm. | 37.8 | 36 | 95 |
| 5 cm. | 43.8 | 42.6 | 97 |

The twist test comprised wrapping the wire helically around a 31 mm diameter mandrel 10 times at a pitch of 30°. The mandrel was then twisted 16°, producing a primarily tensile strain in the wire. As can be seen from Table 3, the percentage of critical current retention after twisting in the samples with no splicing was in the range of 91–96%. The percentage of critical current retention after twisting in the samples with a 5 cm splice was in the range of 91–97%. Thus, no measurable difference was apparent in the degradation of wires with and without splices.

EXAMPLE 3

In this Example, a stainless steel laminated multi-filamentary BSCCO silver wire having a splice geometry shown in FIG. 2A was used to measure critical current retention for various twist angles. Again, the wires were wound on a 31 mm diameter mandrel at a 30° pitch, and the mandrel was twisted through angles ranging from 12°–24°, producing increasing strains on the wires. The value of x was 1.5 cm and the value of y was 5 cm. The results of this test are shown in Table 4.

TABLE 4

Critical Current Retention

| Twist Angle | Original $I_c$ (A) (using a 1 $\mu$V/cm criterion for zero resistivity) | Average $I_C$ Retention |
| --- | --- | --- |
| 12° | 25–52 | 96 |
| 16° | 21–49 | 96 |
| 20° | 34–58 | 93 |
| 24° | 30–53 | 92 |

As can be seen, the average critical current retention decreased with increasing twist angle, but remained greater than 90% in all cases.

EXAMPLE 4

In this Example, four splices having a splice geometry shown in FIG. 2B were used to evaluate the mechanical performance of the splice/tape during mechanical (twist) testing. The four splices were wrapped at a 30° pitch on a 31 mm diameter mandrel and twist tested at 16°10 times using a silver BSCCO (bismuth, strontium, calcium, copper and oxygen) multi-filament wire. The critical current retention for the spliced and unspliced wire was 95% or greater.

Figure 4:
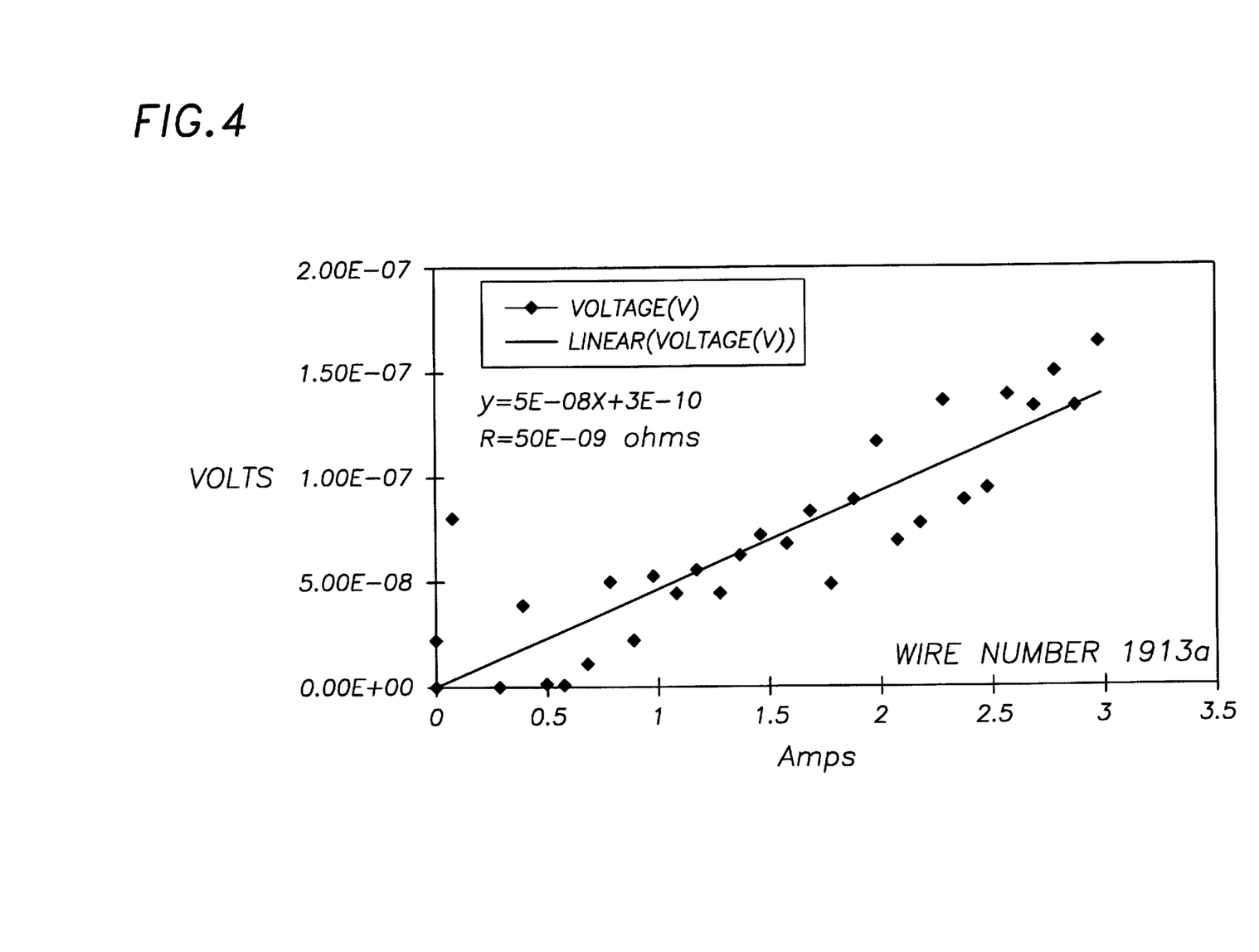
FIG. 4 illustrates a plot of volts v. amps during mechanical performance evaluation in accordance with one embodiment of the invention.

The measured resistance of the splice at 77K was also measured with voltage taps about 6 cm on either side of the splice. A plot of the measured voltage v. current is shown in FIG. 4. The resistance, which was determined from the slope of the current-voltage curve, was measured at about 50 nano-ohms.

This application incorporates by reference "Methods for Joining High Temperature Superconducting Components in a Superconducting Cable Without Critical Current Degradation and Articles of Manufacture in Accordance Therewith," filed on even day herewith as U.S. Ser. No. 09/324,144 (attorney docket 0019696-0144).

It should be appreciated by those skilled in the art that the specific embodiments disclosed above may readily be utilized as a basis for modifying or designing other methods or structures for carrying out the same purpose of the present invention. It should also be realized by those skilled in the art that such equivalent constructions do not depart from the spirit and scope of the invention as set forth in the appended claims.

What is claimed is:

1. A high temperature superconducting article, comprising:
   a first high temperature superconducting component having first and second ends;
   a layer of a first solder material, a portion of the solder layer attached to at least a portion of the first high temperature superconducting component;
   a second high temperature superconducting component having first and second ends, at least a portion of the second high temperature superconducting component attached to a portion of the solder layer; and
   at least one protective layer connected to the first and second high temperature superconducting components,
   wherein the portion of the first high temperature superconducting component attached to the solder material and the portion of the second high temperature superconducting component attached to the solder material form an overlap segment having a critical current at least 80% of the lesser of critical currents of the first and second high temperature superconducting components, the overlap segment critical current being measured over an article length at least 100 times the length of the overlap segment, where critical current is determined using a 1 $\mu$V/cm criterion.

2. The article of claim 1, wherein the overlap segment has a critical current at least 85% of the lesser of the critical currents of the first and second high temperature superconducting components.

3. The article of claim 1, wherein the overlap segment has a critical current at least 90% of the lesser of the critical currents of the first and second high temperature superconducting components.

4. The article of claim 1, wherein the overlap segment has a critical current at least 95% of the lesser of the critical currents of the first and second high temperature superconducting components.

5. The article of claim 1, wherein the overlap segment has a critical current at least 99% of the lesser of the critical currents of the first and second high temperature superconducting components.

6. The article of claim 1, wherein the first and second high temperature superconducting components comprise the same materials.

7. The article of claim 1, wherein the first end of the first superconducting component has a substantially triangular end.

8. The article of claim 7, wherein the first end of the second superconducting component has a substantially triangular end.

9. The article of claim 8, wherein the first ends of the first and second high temperature superconducting components define the overlap segment length.

10. The article of claim 1, wherein the first end of the first superconducting component has a substantially diagonal end.

11. The article of claim 10, wherein the first end of the second superconducting component has a substantially diagonal end.

12. The article of claim 11, wherein the first ends of the first and second high temperature superconducting components define the overlap segment length.

13. The article of claim 1, wherein the first end of the first superconducting component has a substantially inverted triangular end.

14. The article of claim 13, wherein the first end of the second superconducting component has a substantially inverted triangular end.

15. The article of claim 14, wherein the first ends of the first and second high temperature superconducting components define the overlap segment length.

16. The article of claim 1, wherein the protective layer comprises at least one of the group consisting of stainless steel, copper, copper—beryllium alloys, nickel-base superalloys, and nickel—iron-base superalloys.

17. The article of claim 1, wherein the first and second high temperature superconducting materials comprise at least one of (Bi,Pb)SSCO or YBCO.

18. The article of claim 1, wherein the protective layer is attached by means of a second solder material.

19. The article of claim 18, wherein the second solder material has a lower melting point than the first solder material.

20. A method for joining at least two high temperature superconducting components, comprising:

providing a first high temperature superconducting component having first and second ends;

providing a second high temperature superconducting component having first and second ends;

applying a solder layer to the first and second high temperature superconducting components to form a joint; and applying at least one protective layer to the first and second high temperature superconducting components, wherein the portion of the first high temperature superconducting component attached to the solder material and the portion of the second high temperature superconducting component attached to the solder material form an overlap segment having a critical current at least 80% of the lesser of critical currents of the first and second high temperature superconducting components, the overlap segment critical current being measured over an article length at least 100 times the length of the overlap segment, where critical current is determined using a 1 $\mu$V/cm criterion.

21. The method of claim 20, wherein the overlap segment has a critical current at least 85% of the lesser of the critical currents of the first and second high temperature superconducting components.

22. The method of claim 20, wherein the overlap segment has a critical current at least 90% of the lesser of the critical currents of the first and second high temperature superconducting components.

23. The method of claim 20, wherein the overlap segment has a critical current at least 95% of the lesser of the critical currents of the first and second high temperature superconducting components.

24. The method of claim 20, wherein the overlap segment has a critical current at least 99% of the lesser of the critical currents of the first and second high temperature superconducting components.

25. The method of claim 20, wherein the first end of the first high temperature superconducting component is substantially triangular.

26. The method of claim 25, wherein the first end of the second high temperature superconducting component is substantially triangular.

27. The method of claim 20, wherein the first end of the first high temperature superconducting component is substantially diagonal.

28. The method of claim 27, wherein the first end of the second high temperature superconducting component is substantially diagonal.

29. The method of claim 20, wherein the first end of the first high temperature superconducting component is substantially inverted triangular.

30. The method of claim 29, wherein the first end of the second high temperature superconducting component is substantially inverted triangular.

31. The method of claim 20, wherein the protective layer is attached by means of a second solder layer.

32. The method of claim 31, wherein the second solder layer has a lower melting temperature than the first solder layer.

* * * * *

UNITED STATES PATENT AND TRADEMARK OFFICE
CERTIFICATE OF CORRECTION

PATENT NO. : 6,159,905  
DATED : December 12, 2000  
INVENTOR(S) : Buczek et al.

Page 1 of 1

It is certified that error appears in the above-identified patent and that said Letters Patent is hereby corrected as shown below:

<u>Title page,</u>  
The last name of the first inventor is spelled incorrectly. The name should read
-- David M. Buczek --.

Signed and Sealed this

Twenty-first Day of May, 2002

*Attest:*

JAMES E. ROGAN  
*Attesting Officer*     *Director of the United States Patent and Trademark Office*